United States Patent [19]

Ehle et al.

[11] 4,053,334

[45] Oct. 11, 1977

[54] METHOD FOR INDEPENDENT CONTROL OF VOLATILE DOPANTS IN LIQUID PHASE EPITAXY

[75] Inventors: Roger S. Ehle; Walter Garwacki, both of Schenectady, N.Y.

[73] Assignee: General Electric Company, Schenectady, N.Y.

[21] Appl. No.: 707,274

[22] Filed: July 21, 1976

[51] Int. Cl.² .......................................... H01L 21/208
[52] U.S. Cl. .................... 148/171; 148/172; 118/415
[58] Field of Search ............... 148/171, 172, 1.5; 118/415

[56] References Cited

U.S. PATENT DOCUMENTS

| | | | |
|---|---|---|---|
| 3,677,836 | 7/1972 | Lorenz | 148/171 |
| 3,870,575 | 3/1975 | Dosen | 148/171 |
| 3,933,538 | 1/1976 | Akai et al. | 148/171 |

Primary Examiner—G. Ozaki
Attorney, Agent, or Firm—Geoffrey H. Krauss; Joseph T. Cohen; Jerome C. Squillaro

[57] ABSTRACT

A method for independent control of a plurality of volatile dopants in liquid phase epitaxial fabrication of doped layers of semiconductors upon a semiconductor substrate, utilizes spatially separated sources of each dopant, each source being independently temperature controlled. One dopant source is located in a melt of a carrier metal and of the elements required to form the desired semiconductor material and has the saturation concentration thereof determined by the temperature of the melt, while the remaining dopant is vaporized to create a partial pressure thereof over the melt, with control of the source temperature controlling partial pressure and therefore concentration, which is less than or equal to the solubility of the remaining dopant at the melt temperature, in the melt.

13 Claims, 3 Drawing Figures

METHOD FOR INDEPENDENT CONTROL OF VOLATILE DOPANTS IN LIQUID PHASE EPITAXY

BACKGROUND OF THE INVENTION

The present invention relates to epitaxially grown semiconductor devices and more particularly to a novel method for the independent control of a plurality of volatile dopants in a semiconductor device fabricated by liquid phase epitaxy.

Semiconductor devices, such as red light-emitting-diodes (LEDs) and the like, will operate with very high relative quantum efficiency, i.e., the ratio of emitted photons per unit time to the numer of electrons flowing through the device in the same time interval, only if the semiconductor material is activated with a specific concentration of at least one dopant. Thus, it is known that a LED utilizing p-type gallium phosphide (GaP) and having a lattice doped with a pair of zinc and oxygen (Zn-O) atoms to form luminescent-recombination centers therein, will operate with a very high quantum efficiency only if a delicate balance is maintained between Zn-O pairs and the amount of excess zinc and/or oxygen in the p-type GaP material. It is desired to derive a method for independent, accurate and reproducible control of these volatile dopants in a liquid phase epitaxy (LPE) system compatible with high volume semiconductor device manufacturing.

BRIEF SUMMARY OF THE INVENTION

In accordance with the invention, a method for independent control of volatile dopants in liquid phase epitaxy for fabricating a layer of a doped semiconductor material upon a substrate, comprises the steps of: providing a melt, at a first temperature, of a carrier metal and of the elements required to form the semiconductor material; introducing a quantity of a first material into said melt to provide a first volatile dopant therein at a saturation concentration determined by the temperature of the melt; providing at least one other volatile dopant at a selected partial pressure above the surface of the melt to control the concentration of the at least one other volatile dopant in the melt; and epitaxially growing a layer of the semiconductor material upon a surface of the substrate, the semiconductor material of the layer being doped with all of the volatile dopants in amounts independently controllable by controlling the temperature of the melt (for the concentration of the first dopant) and by controlling the temperature of the remotely located source or sources (for the concentration of the other dopants). The LPE fabrication process is carried out in a sealed volume, with the sealing means including at least one element of the semiconductor material to prevent contamination of the substrate and the doped material epitaxially deposited thereon.

Accordingly, it is an object of the present invention to provide a method for independently controlling the concentration of at least a pair of different volatile dopants in a liquid phase epitaxial fabrication process.

This and other objects of the present invention will become apparent upon a consideration of the following detailed description and the drawings.

DETAILED DESCRIPTION OF THE INVENTION

Figure 1:
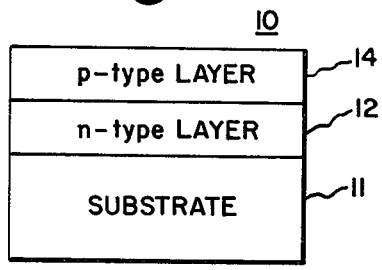
FIG. 1 is a side view of one possible light emitting diode to be fabricated, in part, by a novel method in accordance with the principles of the present invention.
Figure 2:
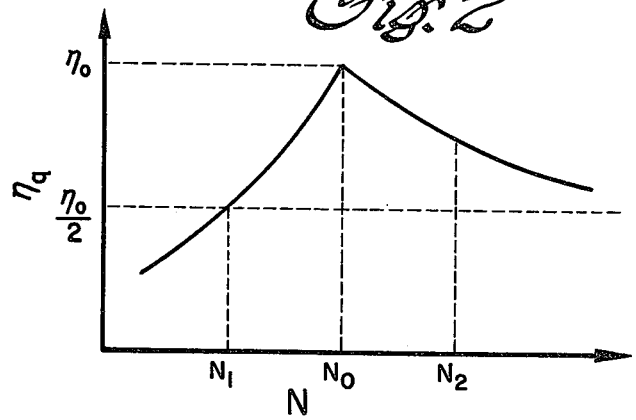
FIG. 2 is a graph illustrating the quantum efficiency of a GaP light emitting diode with respect to changes in the concentration of dopant atoms per volume of an epitaxial layer.

Referring initially to FIGS. 1 and 2, a typical light emitting diode 10 comprises a substrate 11 of a wafer of crystalline semiconductor material, such as gallium phosphide (GaP) and the like. Using the aforementioned GaP semiconductor material, an n-type GaP layer 12 is fabricated upon a surface of substrate 11 by liquid phase epitaxy, i.e. forming a liquid melt of the elements (gallium and phosphorous) required for the GaP semiconductor material and a donor (n-type) material, such as sulphur and the like, and utilizing substrate 11 as a "seed" whereby, when substrate 11 is dipped into the melt and the melt is slowly cooled, a layer 12 of donor-doped GaP semiconductor material, typically having a net donor atom concentration approximately equal to $5 \times 10^{17}$ atoms per cubic centimeter, is fabricated upon the surface of substrate 11. A second layer 14 of a p-type GaP semiconductor material is fabricated on the remaining surface of n-type layer 12 by liquid phase epitaxy; a liquid melt of Ga and P is doped with a quantity of an acceptor material, such as zinc and the like, which acceptor material and oxygen concentrate in the melt and, upon cooling thereof, forms an outermost layer upon first layer 12, opposite substrate 11.

It is known that a delicate balance between the pairs of zinc and oxygen atoms and the excess zinc and/or oxygen must be maintained to realize a relatively very high quantum efficiency, i.e., the ratio of photon quanta emitted per unit time by the device 10 to the number of electrons flowing through the device in the same time interval. In a typical LED using zinc-oxygen pairs for the luminescent-recombination centers in a p-type gallium phosphide layer, quantum efficiencies as illustrated in FIG. 2 may be achieved. As shown, with quantum efficiency $\eta_q$ being plotted for increasing values along the ordinate and increasing values of effective dopant concentrations N, i.e., the difference between the number of acceptor atoms $N_A$ (of acceptor material such as zinc and the like) and the number of residual impurity atoms $N_D$ in the p-type gallium phosphide, the peak quantum efficiency $\eta_o$ occurs for an optimum dopant concentration $N_O$. For some reduced effective acceptor concentration, $N_1$, the quantum efficiency falls to approximately one-half the peak value, while at an equal percentage increase of effective acceptor concentration $N_2$, relative to the desired effective dopant concentration, the efficiency has decreased, although not as great as for the lesser concentration value $N_1$.

A high degree of reproducibility, over a large number of layer fabrications, of the peak achievable quantum efficiency requires that the dopants, herein being of the zinc-oxygen luminescent-recombination-center-forming type in p-type GaP semiconductor material, as well as the unpaired excess Zn and O atoms, all be closely controlled. The dopants are typically of extremely volatile characteristic whereby the dopants (and particularly zinc and oxygen) will be easily vaporized out of the liquid melt utilized for fabrication of the epitaxial layer.

We have found that the concentration of each of a plurality of volatile dopants can be independently controlled in the LPE process by spatially separating the source of each of the dopants and by introducing all but one of the dopants as a vapor over the liquid melt, with the last dopant being contained directly in the melt. Spatial separation allows the temperature of a dopant source to be controlled whereby the partial pressure of the vapor of that dopant, over the melt, is highly controllable such that the effective concentration in the melt of each of the dopants derived from a spatially separated source is controllable between essentially zero and the solubility of that dopant in the melt at the melt temperature. The concentration of the single remaining dopant is the saturation solubility of that dopant in the melt and is controlled by the temperature of the liquid melt itself, whereby each of the dopant concentrations is controllable responsive only to the temperature of a spatially separate, and therefore essentially independent, source.

Figure 3:
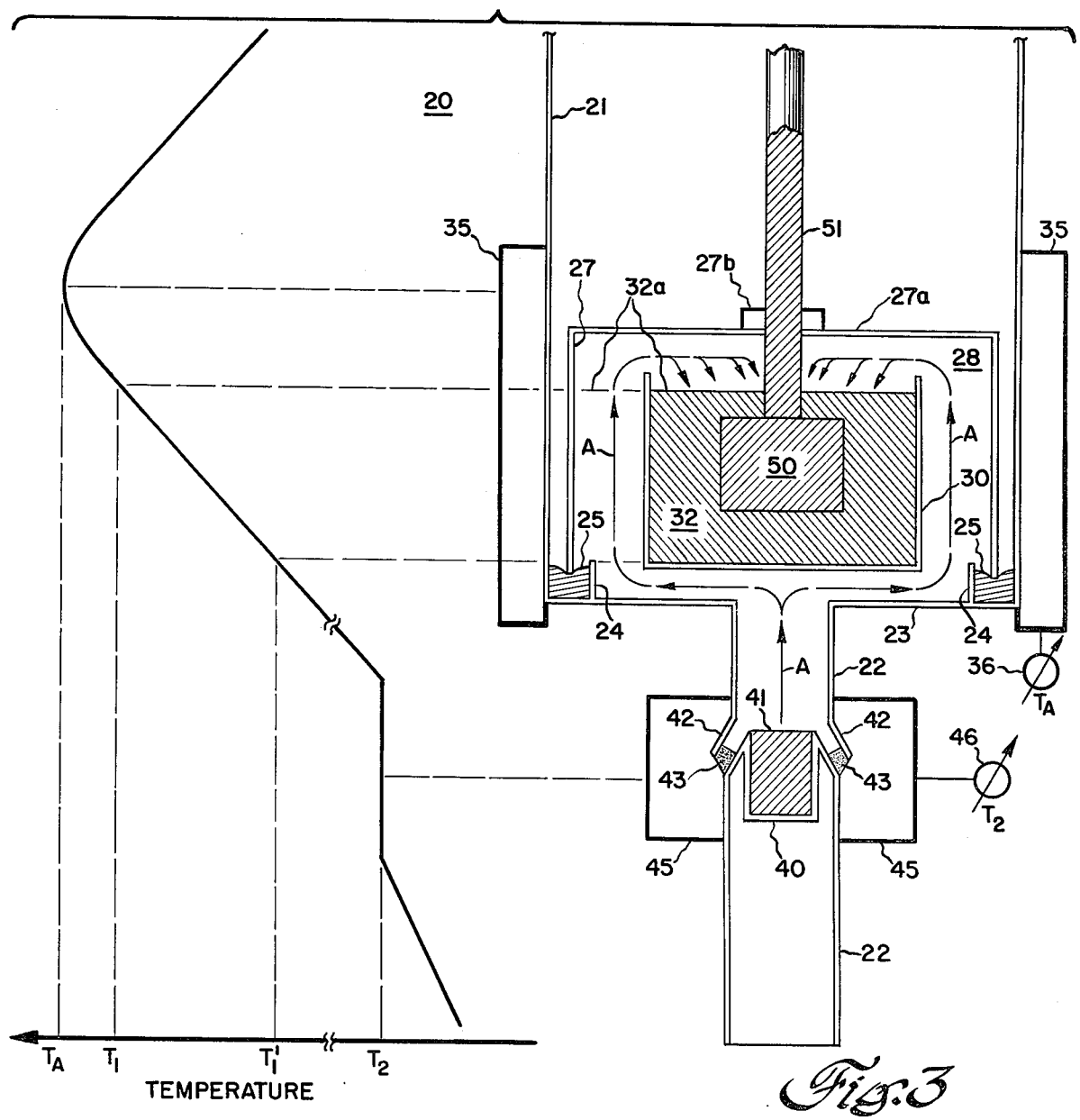
FIG. 3 is a side section through a vertical LPE system, illustrating the spatially separated and independently temperature controlled volatile dopant sources and including a graph relating temperature to the physical location of various members within the fabrication system.

Referring now to FIG. 3, a vertical LPE reactor 20 comprises a pair of axially aligned tubes 21 and 22 of differing diameters, with the larger diameter tube 21 being mounted above the lesser diameter tube 22 and joined thereto by an end plate 23. A ring 24, of diameter slightly less than the inner diameter of upper tube 21, is joined to the upper surface of end plate 23 to form an annular channel containing at least one of the elements (Ga) utilized in the semiconductor material of substrate 11. A bell 27, of diameter approximately equal to the average of the inner diameter of upper tube 21 and the outer diameter of ring 24, has the circular edge of its open end positioned within the annular ring formed by wall 24, whereby, when the quantity 25 is heated to the molten liquid state, a seal is formed, enclosing volume 28 inside bell 27 and end plate 23; any additional non-dopant atoms released into volume 28 will therefore be atoms of the sealing material 25, which atoms are part of the semiconductor itself.

A carrier 30 of high-purity impervious material, such as ceramic material and the like, is positioned within the volume 28 and essentially clear of the surfaces of end plate 23 and bell 27, whereby an unimpeded channel extends from the interior of lower tube 22, through volume 28 to the open top surface of carrier 30. A quantity 32 of a material comprising the elements (e.g. Ga and P) of the desired semiconductor material, e.g. GaP, is positioned in carrier 30. A first furnace means 35 surrounds a portion of the exterior of upper tube 21 and generally extends between a line below end plate 23 and a line above the upper surface 27a of the bell; the amount of heat energy supplied to the interior volume of upper tube 21, and hence the temperature therein, is controlled by means of a temperature-adjustment means 36 associated with furnace means 35 for establishing an upper-tube maximum temperature $T_A$.

Another carrier 40 is positioned in an intermediate section of lower tube 22 and contains a quantity of a material 41 from which a volatile dopant, such as zinc and the like, can be vaporized. Advantageously, lower tube 22 includes one or more ports 42 for facilitating the loading of dopant material 41 within second carrier 40. Each port is closed by seal means 43 after loading and before operation of the system is commenced.

A second furnace means 45 annularly encloses the intermediate section of lower tube 22 containing carrier 40. A second temperature control means 46 is coupled to second furnace means 45 to establish the quantity of heat energy transmitted to dopant material 41 and, hence, the temperature $T_2$ thereof.

In operation, a mass 50 of a material containing a compound of a first dopant and at least one element of the semiconductor material, such as a mass of gallium oxide ($Ga_2O_3$) where the first dopant is oxygen, is attached to the end of a rod 51 and the rod is positioned through a sealing means 27b in the top surface 27a of the bell. The bell is lowered to position mass 50 within the molten mass 32. Temperature controlling means 36 has previously been set to establish the temperature at a point above the surface of bell top surface 27a at a temperature $T_A$ sufficient to bring the temperature of quantity 32 to temperatures $T_1$ and $T_1'$, respectively, at respective top and bottom surfaces of carrier 30 with both temperatures being essentially equal to the temperature required for the desired saturation solubility of the first dopant in the melt. Mass 50 is of a quantity sufficient to saturate the melt 32 with the desired concentration of the first volatile dopant, which concentration is controlled by adjustment of temperature $T_A$. Rod 51 withdraws any remaining portion of mass 50; substrate 11, having n-type layer 12 already fabricated thereon, replaces mass 50 at the end of rod 51 and is positioned within melt 32, now saturated with a desired concentration of the first volatile dopant, e.g., oxygen.

Second temperature controlling means 46 is set to cause second furnace means 45 to establish the interior temperature $T_2$ (between about 450° to about 700° C) in the intermediate portion of lower tube 22 at the temperature of vaporization of the mass 41 of the second dopant-bearing material, whereby the second dopant, e.g., zinc ($T_2$ about 470° C), is evaporated from mass 41 and rises, in the direction of arrows A, to the upper portion of tube 22 and around carrier 30 within volume 28. The atoms of the second dopant thus form a partial pressure over the upper melt surface 32a to cause an amount of the second dopant atoms to enter the melt.

The maximum concentration of the second dopant atoms is determined by the saturation solubility of the second dopant in the melt at the controlled temperature of the latter; the actual concentration is variable between essentially zero and the maximum concentration by controlling the temperature of the source of the second volatile dopant (e.g. zinc) independently of the melt temperature to establish the partial vapor pressure of the second dopant over, and therefore the concentration in, the melt. It should be understood that additional dopant sources may be spatially separated from melt carrier 30 and additional carrier 40, and positioned in additional lower tubes (not shown for purposes of simplicity), each of which additional lower tubes not only opens through end plate 23 into volume 28 but also has an intermediate portion thereof supporting a carrier of another dopant, with the carrier surrounded by an independent furnace means with its associated temperature-controlling means (each separated from the other), whereby the partial pressures of each of a plurality of dopants from spatially-separated sources may be precisely controlled over the melt to control the concentration of each dopant in the melt, with the concentration of the last required dopant, physically supplied from and saturating melt 32, being controlled by the temperature $T_A$ of the upper reactor tube and by the vapor-tight enclosure formed by bell 27 and the sealing quantity 25.

Upon introduction of the desired concentration of the plurality of volatile dopants (the oxygen and zinc atoms of the preferred embodiment), the temperature of melt 32 is decreased whereupon a layer of the semiconductor material having the desired concentration of both volatile dopants is fabricated upon the exterior surface of the layer 12 previously deposited upon substrate 11, now contained within cooling melt 32. The multiple-layered substrate is removed, by withdrawal of rod 51, after a time interval selected to fabricate layer 14 to a desired thickness.

Fabrication of the epitaxial layer 14 removes finite quantities of the first dopant and the least one element of the semiconductor material, whereby, after fabrication of some volume of epitaxial layer (on one or more substrates), the melt will no longer contain a concentration of dopant and semiconductor material constituent atoms sufficient to saturate the melt at the process temperature. At this time, replenishment of the dopant and semiconductor material elements in the melt is obtained by again positioning (as hereinabove described) a mass 50, of the material containing a compound of the first dopant and the at least one element of the semiconductor material, in the melt.

There has just been described a method for the accurate, reproducible and independent control of a plurality of volatile dopants in liquid phase epitaxial fabrication of doped layers of semiconductor material upon a semiconductor substrate through the use of spatially separated sources of each dopant with each source being independently temperature controlled.

While the present invention has been described with reference to one particular embodiment of our novel volatile dopant independent control method, many variations and modifications will now become apparent to those skilled in the art. It is our intent, therefore, that the scope be limited not by the foregoing description, but only by the appending claims.

What is claimed as new is:

1. A method for the independent control of the concentration of each of a plurality of volatile dopants in a doped layer of a semiconductor material fabricated by liquid phase epitaxy upon a semiconductor substrate, comprising the steps of:
    a. providing a substantially vapor-tight volume;
    b. providing a first quantity of at least one element of the semiconductor material within said volume;
    c. heating said first quantity to a selected temperature sufficient to melt said first quantity;
    d. saturating the molten first quantity with a desired quantity of a first volatile dopant;
    e. immersing said substrate in said molten first quantity;
    f. providing a source of a second volatile dopant at a position below and spatially removed from said molten first quantity;
    g. independently heating said source of said second volatile dopant to cause a vapor thereof to rise without use of a carrier gas and be present at a selected partial pressure above a surface of said molten first quantity to achieve a desired concentration of said second volatile dopant within said molten first quantity at the selected temperature thereof; and
    h. cooling said molten first quantity containing said substrate and said first and second volatile dopants in their respective concentrations, to fabricate a doped layer of said semiconductor material upon said substrate.

2. A method as set forth in claim 1, wherein step (d) comprises the steps of: introducing a quantity of a compound of at least one element of the semiconductor material and of the first volatile dopant into the molten first quantity, said compound being present in a quantity sufficient to saturate the molten first quantity; and controlling the temperature of said molten first quantity to achieve a selected concentration of said first volatile dopant therein.

3. A method as set forth in claim 2, wherein one element of said semiconductor material is gallium.

4. A method as set forth in claim 3, wherein said semi-conductor material is gallium phosphide.

5. A method as set forth in claim 3, wherein said first volatile dopant is oxygen.

6. A method as set forth in claim 5, wherein said compound is gallium oxide ($Ga_2O_3$).

7. A method as set forth in claim 1, further comprising the steps of adjusting the temperature of said source of said second volatile dopant to establish the concentration of said second volatile dopant in said molten first quantity at a selected level between essentially zero and the saturation solubility of said second volatile dopant at said selected temperature in said molten first quantity.

8. A method as set forth in claim 7, wherein said second volatile dopant is zinc.

9. A method as set forth in claim 8, wherein said semiconductor material is gallium phosphide.

10. A method as set forth in claim 9, wherein said first volatile dopant is oxygen.

11. A method as set forth in claim 10, wherein said compound is gallium oxide ($Ga_2O_3$).

12. A method as set forth in claim 1, further comprising the steps of: providing a quantity of each of at least one other material each containing another volatile dopant differing from said first and second volatile dopants; locating the quantity of each of said at least one other material below and spatially separated from both said quantity of material containing said second volatile dopant and from said molten first quantity; heating the quantity of each of said at least one other material to vaporize the volatile dopant thereof into said volume without use of a carrier gas; and independently controlling the temperature of the quantity of each of said at least one other material to regulate the partial vapor pressure therefrom upon a surface of, and the concentration within, said molten first quantity to independently control the concentration of each additional volatile dopant within said epitaxially fabricated layer.

13. A method as set forth in claim 1, wherein said substrate has a previously fabricated epitaxial layer thereon.

* * * * *